United States Patent
Yamamoto

(10) Patent No.: US 7,366,487 B2
(45) Date of Patent: Apr. 29, 2008

(54) RECEIVING BAND SWITCHING CIRCUIT WITH REDUCED SIGNAL LOSS UPON SWITCHING RECEIVING BAND

(75) Inventor: Masaki Yamamoto, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 423 days.

(21) Appl. No.: 11/205,612

(22) Filed: Aug. 16, 2005

(65) Prior Publication Data
US 2006/0040626 A1    Feb. 23, 2006

(30) Foreign Application Priority Data
Aug. 20, 2004 (JP) ............................ 2004-240988

(51) Int. Cl.
*H04B 1/18* (2006.01)
(52) U.S. Cl. .............................. 455/188.1; 455/191.3; 333/132
(58) Field of Classification Search ............ 455/78–83, 455/180.1, 188.1, 188.2, 190.1, 191.1–191.3; 333/132–137
See application file for complete search history.

(56) References Cited

U.S. PATENT DOCUMENTS

| | | | |
|---|---|---|---|
| 4,912,520 A | | 3/1990 | Yamamoto et al. |
| 5,499,056 A | * | 3/1996 | Pugel ........................ 348/731 |
| 6,889,036 B2 | * | 5/2005 | Ballweber et al. .......... 455/292 |
| 6,917,258 B2 | * | 7/2005 | Kushitani et al. ........... 333/103 |

FOREIGN PATENT DOCUMENTS

| | | |
|---|---|---|
| EP | 1 282 239 | 5/2003 |
| JP | S63-064138 | 4/1988 |
| JP | 2003-209758 | 7/2003 |
| JP | 2003133912 | 9/2003 |

* cited by examiner

*Primary Examiner*—Blane J. Jackson
(74) *Attorney, Agent, or Firm*—Brinks Hofer Gilson & Lione

(57) ABSTRACT

A receiving band switching circuit includes a first high frequency circuit through which a first frequency band signal passes, a second high frequency circuit through which a second frequency band signal passes, and a third high frequency circuit that is provided in the back of the first and second high frequency circuits. The third high frequency circuit is constituted by a balanced circuit having balanced input terminals. The first high frequency circuit is coupled to one of the balanced input terminals, and the second high frequency circuit is coupled to the other of the balanced input terminals. When the first frequency band signal outputted from the first high frequency circuit is inputted to the third high frequency circuit, the other of the balanced input terminals is grounded. When the second frequency band signal outputted from the second high frequency circuit is inputted to the third high frequency circuit, one of the balanced input terminals is grounded.

5 Claims, 1 Drawing Sheet

RECEIVING BAND SWITCHING CIRCUIT WITH REDUCED SIGNAL LOSS UPON SWITCHING RECEIVING BAND

This application claims the benefit of priority to Japanese Patent Application No. 2004-240988, filed on Aug. 20, 2004, herein incorporated by reference.

BACKGROUND OF THE INVENTION

1. Field of the Invention

The present invention relates to a receiving band switching circuit suitable for a television tuner or the like.

2. Description of the Related Art

FIG. 2 shows a related art receiving band switching circuit. A band pass filter (BPF) for FM 1 and a band pass filter (BPF) for TV 2 are provided between a front end and an antenna (ANT) for receiving a television signal and an FM broadcasting signal. The BPF for FM 1 is connected to the antenna through a diode D1, and is connected to the front end through a diode D2. The BPF for TV 2 is connected to the antenna through a diode D3, and is connected to the front end through a diode D4.

Cathodes of the diodes D1 and D3 are connected to the antenna, and are connected to a ground through a resistor R2. In addition, cathodes of the diodes D2 and D4 are connected to the front end, and are connected to a ground through a resistor R4. Anodes of the diodes D1 and D2 are connected to an FM terminal of a switch 3 through resistors R1 and R3, respectively, and anodes of the diodes D3 and D4 are connected to a TV terminal of the switch 3 through resistors R5 and R6, respectively.

Further, a voltage (+B) is applied between the FM terminal and the TV terminal, such that the diodes D3 and D4 or the diodes D1 and D2 are supplied with a current. The BPF for FM 1 or the BPF for TV 2 is switched, such that the FM broadcasting signal or television signal is switched and is inputted to the front end (for example, Japanese Unexamined Utility Model Registration Application Publication No. 63-64138 (FIG. 2)).

The resistors R2 and R4 are connected in parallel with the antenna and the front end, respectively, in order to cause the diodes D1 to D4 to be supplied with a current. However, in order to cause a current to flow in the diodes D1 to D4, it is impossible to increase the resistance values of the resistors R2 and R4. As a result, there is a problem in that the loss of a signal is increased.

SUMMARY OF THE INVENTION

It is an object of the present invention to provide a receiving band switching circuit with a reduced signal loss upon switching a receiving band.

According to a first aspect of the invention, a receiving band switching circuit includes a first high frequency circuit through which a first frequency band signal passes, a second high frequency circuit through which a second frequency band signal passes, and a third high frequency circuit that is provided in the back of the first and second high frequency circuits. The third high frequency circuit is constituted by a balanced circuit having balanced input terminals. The first high frequency circuit is coupled to one of the balanced input terminals, and the second high frequency circuit is coupled to the other of the balanced input terminals. When the first frequency band signal outputted from the first high frequency circuit is inputted to the third high frequency circuit, the other of the balanced input terminals is grounded. When the second frequency band signal outputted from the second high frequency circuit is inputted to the third high frequency circuit, one of the balanced input terminals is grounded.

According to a second aspect of the invention, the receiving band switching circuit may further include a first switching transistor of which an emitter is grounded and of which a collector is connected to one of the balanced input terminals, and a second switching transistor of which an emitter is grounded and of which a collector is connected to the other of the balanced input terminals. In this case, the collector of the first switching transistor may be pulled up to a power supply through a first resistor, and the collector of the second switching transistor may be pulled up to the power supply through a second resistor.

According to a third aspect of the invention, the third high frequency circuit may be constituted by a frequency converting mixer. The first high frequency circuit may have a low band amplifier that amplifies a low band television signal in a VHF band and a low band tuning circuit that is provided in the back of the low band amplifier. Further, the second high frequency circuit may have a high band amplifier that amplifies a high band television signal in the VHF band and a high band tuning circuit that is provided in the back of the high band amplifier.

According to a fourth aspect of the invention, the low band tuning circuit may be connected to one of the balanced input terminals through a first coupling varactor diode, and the high band tuning circuit may be connected to the other of the balanced input terminals through a second coupling varactor diode. Anodes of the first and second varactor diodes may be disposed on sides of the balanced input terminals, respectively. The balanced input terminals may be connected to each other through a third resistor. The low band tuning circuit and high band tuning circuit may be applied with a tuning voltage and may be provided with tuning varactor diodes, respectively. Cathodes of the first and second varactor diodes may be applied with the tuning voltage.

According to a fifth aspect of the invention, the receiving band switching circuit may further include an integrated circuit that has a mixer constituted therein and the balanced input terminals. The first and second switching transistors and the first to third resistors may be constituted in the integrated circuit.

DESCRIPTION OF THE PREFERRED EMBODIMENT

Figure 1:
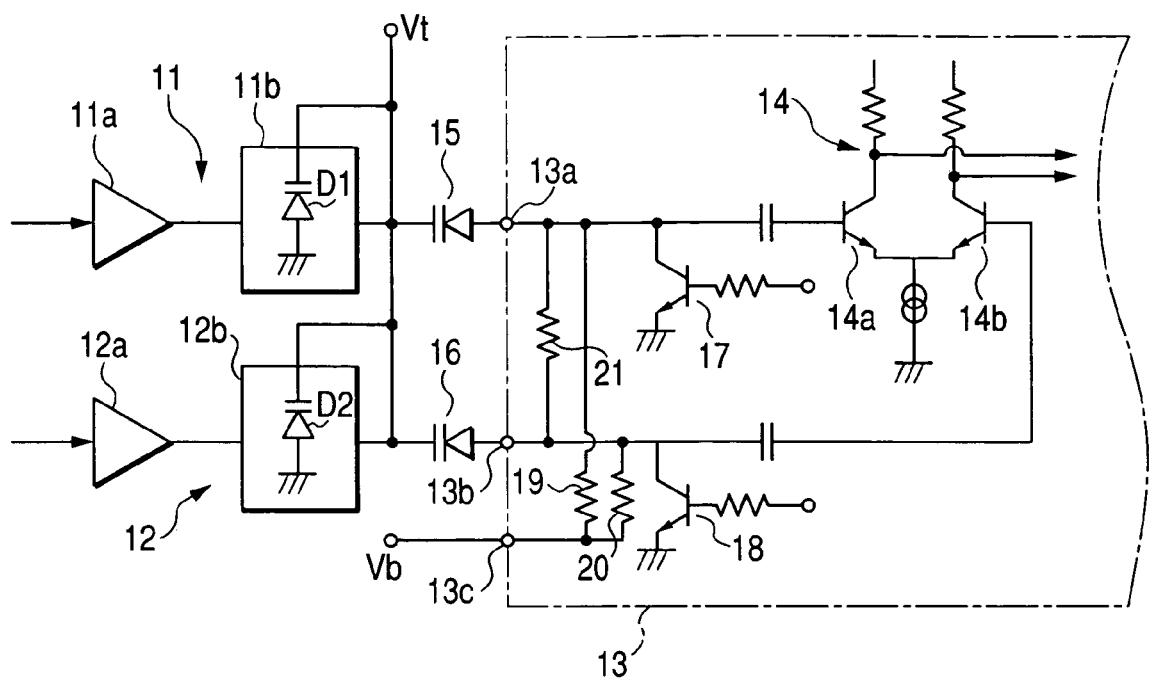
FIG. 1 is a circuit diagram showing the configuration of a receiving band switching circuit according to the invention.
Figure 2:
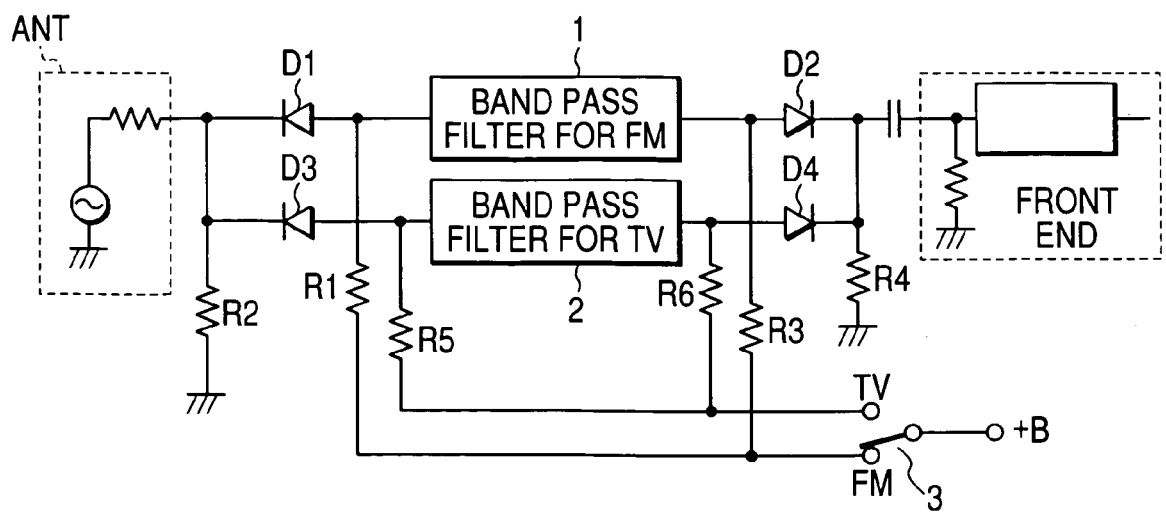
FIG. 2 is a circuit diagram showing the configuration of a receiving band switching circuit according to the related art.

FIG. 1 shows a receiving band switching circuit according to the invention. A first high frequency circuit 11 has a low band amplifier 11a for amplifying a first frequency band signal, for example, a low band television signal in a VHF band, and a low band tuning circuit 11b connected to the next stage of the low band amplifier 11a. A second high frequency circuit 12 has a high band amplifier 12a for amplifying a second frequency band signal, for example, a high band television signal in a VHF band, and a high band tuning circuit 12b connected to the next stage of the high band amplifier 12a.

The low band tuning circuit 11b and the high band tuning circuit 12b are provided with tuning varactor diodes D1 and D2, respectively. By a tuning voltage Vt applied to cathodes of the tuning varactor diodes, tuning frequencies of the respective tuning circuits 11b and 12b are changed according to a frequency of a television signal to be received.

An integrated circuit 13 has a frequency-converting balanced mixer 14 which becomes a third high frequency circuit. The balanced mixer 14 has differentially connected transistors 14a and 14b. A base of the transistor 14a is connected to one terminal 13a of balanced input terminals 13a and 13b provided in the integrated circuit 13 and a base of the transistor 14b is connected to the other terminal 13b.

In addition, the low band tuning circuit 11b is connected to one terminal 13a through a first coupling varactor diode 15, and the high band tuning circuit 12b is connected to the other terminal 13b through a second coupling varactor diode 16. Anodes of the first and second varactor diodes 15 and 16 are connected to the balanced input terminals 13a and 13b, respectively. As a result, the first high frequency circuit 11 and the second high frequency circuit 12 are coupled to the balanced mixer. In addition, a tuning voltage Vt is applied to cathodes of the first and second varactor diodes 15 and 16.

The integrated circuit 13 includes a first switching transistor 17 whose collector is connected to the terminal 13a, and a second switching transistor 18 whose collector is connected to the terminal 13b. Emitters of the respective transistors 17 and 18 are grounded. In addition, the integrated circuit 13 includes a first resistor 19 that pulls up a collector of the first switching transistor 17 to a power supply B and a second resistor 20 that pulls up a collector of the second switching transistor 18 to the power supply B. These resistors 19 and 20 are connected to a power supply terminal 13c. Further, a third resistor 21 is connected between the balanced input terminals 13a and 13b.

Since the first and second resistors 19 and 20 supply a power supply voltage in order to cause the switching transistors to perform switching operations (on/off operations), the resistance values of the first and second resistors 19 and 20 can be increased. In addition, since a current does not flow in the third resistor 21 only by applying a power supply voltage to anodes of the first and second varactor diodes 15 and 16, the resistance value of the third resistor 21 can be increased.

According to this configuration, when the low band television signal is received, the supply of the power to the high band amplifier 12a stops, such that the high band amplifier 12a enters a non-active state. In addition, the first switching transistor 17 is turned off and the second switching transistor 18 is turned on.

In addition, the low band television signal passes through the lower band amplifier 11a, the low band tuning circuit 11b, and the first varactor diode 15, and then is inputted to one transistor 14a of the mixer 14. At this time, since the base of the other transistor 14b is AC grounded the mixer 14 acts as a non-balanced input-type mixer.

In this case, one input terminal 13a is grounded through the first and second resistors 19 and 20, which are connected to the input terminal 13a in series and is grounded through the third resistor 21. However, since the resistance values of the resistors 19, 20, and 21 can be increased, the loss of the low band television signal can be reduced. In addition, the mixer 14 is supplied with a local oscillating signal from an oscillating circuit (not shown) (included in the integrated circuit 13). As a result, an intermediate frequency signal is balance-outputted from the collector of the transistors 14a and 14b.

On the other hand, when the high band television signal is received, the supply of the power to the low band amplifier 11a stops, such that the low band amplifier 11a enters a non-active state. In addition, the first switching transistor 17 is turned on and the second switching transistor 18 is turned off. Then, the high band television signal passes through the high band amplifier 12a, the high band tuning circuit 12b, and the second varactor diode 16, and then is inputted to one transistor 14b of the mixer 14.

At this time, since the base of one transistor 14a is AC grounded the mixer 14 acts as a non-balanced input-type mixer. In addition, the intermediate frequency signal is balance-outputted from the collectors of the transistors 14a and 14b. In addition, even when the high band television signal is received, the resistance values of the first to third resistors 19 to 21 can be increased, such that the loss of the signal is small.

Further, in each of the first and second varactor diodes 15 and 16, which couple the low band tuning circuit 11b and the high band tuning circuit 12b to the balanced input terminals 13a and 13b, respectively, a capacitance thereof is changed by the tuning voltage Vt in the same manner as the tuning varactor diodes D1 and D2. As a result, when the frequency is low, coupling is increased, thereby preventing a gain from deteriorating.

According to the first aspect of the invention, the third high frequency circuit is constituted by a balanced circuit having balanced input terminals. The first high frequency circuit is coupled to one of the balanced input terminals, and the second high frequency circuit is coupled to the other of the balanced input terminals. When the first frequency band signal outputted from the first high frequency circuit is inputted to the third high frequency circuit, the other of the balanced input terminals is grounded, and when the second frequency band signal outputted from the second high frequency circuit is inputted to the third high frequency circuit, one of the balanced input terminals is grounded. Therefore, the respective frequency band signals can be inputted to the third high frequency circuit by reducing the loss of the frequency band signals.

Further, according to the second aspect of the invention, the receiving band switching circuit further includes a first switching transistor of which an emitter is grounded and of which a collector is connected to one of the balanced input terminals, and a second switching transistor of which an emitter is grounded and of which a collector is connected to the other of the balanced input terminals. The collector of the first switching transistor is pulled up to a power supply through a first resistor, and the collector of the second switching transistor is pulled up to the power supply through a second resistor. Therefore, even though the resistance values of the first and second resistors are increased, the balanced input terminals can be grounded.

Further, according to the third aspect of the invention, the third high frequency circuit is constituted by a frequency converting mixer. The first high frequency circuit has a low band amplifier that amplifies a low band television signal in a VHF band and a low band tuning circuit that is provided in the back of the low band amplifier. Further, the second high frequency circuit has a high band amplifier that amplifies a high band television signal in the VHF band and a high band tuning circuit that is provided in the back of the high band amplifier. Therefore, it is possible to constitute a television tuner in which the loss of the television signals of the two bands can be reduced.

Further, according to the fourth aspect of the invention, the low band tuning circuit is connected to one of the balanced input terminals through a first coupling varactor diode, and the high band tuning circuit is connected to the other of the balanced input terminals through a second coupling varactor diode. Anodes of the first and second varactor diodes are disposed on sides of the balanced input terminals, respectively, the balanced input terminals are connected to each other through a third resistor, the low band tuning circuit and high band tuning circuit are applied with a tuning voltage and are provided with tuning varactor diodes, respectively. Cathodes of the first and second varactor diodes are applied with the tuning voltage. Therefore, when the frequency is low, coupling is increased, thereby preventing a gain from deteriorating.

Further, according to the fifth aspect of the invention, the receiving band switching circuit further includes an integrated circuit that has a mixer constituted therein and the balanced input terminals. The first and second switching transistors and the first to third resistors are constituted in the integrated circuit. Therefore, the receiving band switching circuit can be constituted at low cost.

The invention claimed is:

1. A receiving band switching circuit comprising:
   a first high frequency circuit through which a first frequency band signal passes;
   a second high frequency circuit through which a second frequency band signal passes; and
   a third high frequency circuit that is provided at the output of the first and second high frequency circuits,
   wherein the third high frequency circuit is constituted by a balanced circuit having balanced input terminals,
   the first high frequency circuit is coupled to one of the balanced input terminals,
   the second high frequency circuit is coupled to the other of the balanced input terminals,
   when the first frequency band signal outputted from the first high frequency circuit is inputted to the third high frequency circuit, the other of the balanced input terminals is grounded, and
   when the second frequency band signal outputted from the second high frequency circuit is inputted to the third high frequency circuit, one of the balanced input terminals is grounded.

2. The receiving band switching circuit according to claim 1, further comprising:
   a first switching transistor of which an emitter is grounded and of which a collector is connected to the one of the balanced input terminals; and
   a second switching transistor of which an emitter is grounded and of which a collector is connected to the other of the balanced input terminals,
   wherein the collector of the first switching transistor is pulled up to a power supply through a first resistor, and the collector of the second switching transistor is pulled up to the power supply through a second resistor.

3. The receiving band switching circuit according to claim 1,
   wherein the third high frequency circuit is constituted by a frequency converting mixer,
   the first high frequency circuit has a low band amplifier that amplifies a low band television signal a VHF band and a low band tuning circuit that is provided in the back of the low band amplifier, and
   the second high frequency circuit has a high band amplifier that amplifies a high band television signal in the VHF band and a high band tuning circuit that is provided in the back of the high band amplifier.

4. The receiving band switching circuit according to claim 3,
   wherein the low band tuning circuit is connected to the one of the balanced input terminals through a first coupling varactor diode,
   the high band tuning circuit is connected to the other of the balanced input terminals through a second coupling varactor diode,
   anodes of the first and second varactor diodes are disposed on sides of the balanced input terminals, respectively,
   the balanced input terminals are connected to each other through a third resistor,
   the low band tuning circuit hand high band tuning circuit are applied with a tuning voltage and are provided with tuning varactor diodes, respectively, and
   cathodes of the first and second varactor diodes are applied with the tuning voltage.

5. The receiving band switching switching circuit according to claim 4, further comprising:
   an integrated circuit that has a mixer constituted therein and the balanced input terminals,
   wherein the first and second switching transistors and the first to third resistors are constructed in the integrated circuit.

* * * * *

UNITED STATES PATENT AND TRADEMARK OFFICE
CERTIFICATE OF CORRECTION

PATENT NO. : 7,366,487 B2  Page 1 of 1
APPLICATION NO. : 11/205612
DATED : April 29, 2008
INVENTOR(S) : Masaki Yamamoto It is certified that error appears in the above-identified patent and that said Letters Patent is hereby corrected as shown below:

In the Claims

Column 6, in claim 4, line 37, after "tuning circuit" delete "hand" and substitute --and-- in its place.

Column 6, in claim 5, line 41, delete "switching" (second occurrence).

Signed and Sealed this

Twenty-sixth Day of August, 2008

JON W. DUDAS
*Director of the United States Patent and Trademark Office*